(12) United States Patent
Asano et al.

(10) Patent No.: US 8,399,947 B2
(45) Date of Patent: Mar. 19, 2013

(54) SOLID STATE IMAGING DEVICE

(75) Inventors: Takuya Asano, Hyogo (JP); Yoshiaki Kato, Shiga (JP); Takuya Nohara, Osaka (JP); Sei Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/226,783

(22) Filed: Sep. 7, 2011

(65) Prior Publication Data

US 2011/0316109 A1    Dec. 29, 2011

Related U.S. Application Data

(63) Continuation of application No. PCT/JP2010/001681, filed on Mar. 10, 2010.

(30) Foreign Application Priority Data

Mar. 11, 2009  (JP) .................................. 2009-057769

(51) Int. Cl.
*H01L 27/146* (2006.01)
(52) U.S. Cl. ........................................ 257/435; 257/443
(58) Field of Classification Search .................. 257/435, 257/443
See application file for complete search history.

(56) References Cited

U.S. PATENT DOCUMENTS

| | | | |
|---|---|---|---|
| 7,990,444 B2 * | 8/2011 | Kudoh | .......................... 348/276 |
| 2004/0150733 A1 | 8/2004 | Nagayoshi et al. | |
| 2006/0022235 A1 | 2/2006 | Kanbe | |
| 2006/0092304 A1 * | 5/2006 | Hirota | ............................. 348/311 |
| 2007/0086763 A1 * | 4/2007 | Kanbe | .............................. 396/30 |
| 2007/0126906 A1 | 6/2007 | Kuwahara et al. | |
| 2007/0155042 A1 | 7/2007 | Kanbe | |
| 2007/0158676 A1 | 7/2007 | Kanbe | |
| 2007/0164334 A1 | 7/2007 | Kanbe | |
| 2009/0147121 A1 * | 6/2009 | Inoue et al. | ................... 348/311 |
| 2009/0268066 A1 | 10/2009 | Kanbe | |
| 2009/0268073 A1 | 10/2009 | Kanbe | |
| 2009/0269876 A1 | 10/2009 | Kanbe | |

FOREIGN PATENT DOCUMENTS

| | | |
|---|---|---|
| JP | 7-176714 | 7/1995 |
| JP | 2004-180284 | 6/2004 |
| JP | 2005-166826 | 6/2005 |
| JP | 2006-013176 | 1/2006 |
| JP | 2006-014075 | 1/2006 |
| JP | 2006-041369 | 2/2006 |
| JP | 2007-180509 | 7/2007 |
| JP | 2008-193050 | 8/2008 |

OTHER PUBLICATIONS

International Search Report in PCT/JP2010/001681, dated Apr. 13, 2010.

* cited by examiner

*Primary Examiner* — Douglas Menz
(74) *Attorney, Agent, or Firm* — McDermott Will & Emery LLP

(57) ABSTRACT

A solid-state imaging device includes photoelectric conversion units, vertical transfer units including vertical transfer electrodes, a horizontal transfer unit, a distribution transfer unit including distribution transfer electrodes, and first light-shield layers and second light-shield layers provided on the vertical transfer units and the distribution transfer unit. The first light-shield layers and the second light-shield layers are conductive. The first light-shield layers are provided in a layer different from a layer in which the second light-shield layers are provided. At least one of the first light-shield layers serves as an interconnect electrically connected to the vertical transfer electrodes included in the same row, and at least one of the first light-shield layers on the distribution transfer unit serves as an interconnect electrically connected the distribution transfer electrodes. The first light-shield layers are disposed so as not to overlap with the horizontal transfer unit.

8 Claims, 8 Drawing Sheets

| | Column 1 | Column 2 | Column 3 | Column 1 | Column 2 | Column 3 | |
|---|---|---|---|---|---|---|---|
| V1 | | | | | | | |
| V2 | | | | | | | Distribution transfer unit |
| V3L | V3 | V3R | V3L | V3 | V3R | | |
| V4 | | | | | | | |
| V5L | V5 | V5R | V5L | V5 | V5R | | |
| V6 | | | | | | | |
| H1 | H2 | H1 | H2 | H1 | H2 | | |

SOLID STATE IMAGING DEVICE

CROSS REFERENCE TO RELATED APPLICATION

This is a continuation application of PCT application No. PCT/JP2010/001681 filed on Mar. 10, 2010 designating the United States of America.

BACKGROUND OF THE INVENTION (1) Field of the Invention

The present invention relates to a solid-state imaging device that converts an incident light into an electrical signal and outputs the electrical signal as a video signal.

(2) Description of the Related Arts

Solid state imaging devices are conventionally known that convert an incident light into an electrical signal and output the electrical signal as a video signal, as well as digital still cameras (DSC) that display an image based on the video signal obtained from the solid-state imaging device. In recent years such cameras incorporated with the solid-state imaging device have shown significant progress in image quality and functions, including micronization of a pixel driven by increase in number of pixels.

Regarding the solid-state imaging device, driving methods that decrease the number of pixels in the outputted video signal have been proposed, for improving an output speed of the video signal. The proposed methods include, for example, decimating the pixels to be read out in directions of column and row at a predetermined pitch, and mixing signal charges of a plurality of pixels. As a method for decimating or mixing the pixels, a distribution transfer unit provided between a vertical transfer unit and a horizontal transfer unit for controlling transfer of a signal charge has been proposed, for example as disclosed in PTL 1 (Japanese Unexamined Patent Application Publication No. 2006-13176).

The distribution transfer unit includes independent transfer electrodes provided for each column for independent control, to thereby control the transfer of a signal charge from the vertical transfer unit to the horizontal transfer unit.

Referring to FIGS. 6A, 6B, and 7, an interconnect for electrical connection to the distribution transfer electrode for controlling a signal charge with the distribution transfer unit will be described, on the basis of a conventional solid-state imaging device.

FIG. 6A is a plan view showing a configuration of a solid-state imaging device that includes a conventional charge coupled device (CCD).

A pixel region 1300 includes a photoelectric conversion unit 1100 that converts an incident light into a signal charge, and a vertical transfer unit that transfers the signal charge in a vertical direction (downward in FIG. 6A). The vertically transferred signal charge undergoes a control by the distribution transfer unit while being transferred to a horizontal transfer unit 1120. The signal charge transferred to the horizontal transfer unit 1120 is transferred in a horizontal direction (to the left in FIG. 6A), to be read out by an output unit that converts the signal charge into a voltage and outputs the voltage.

FIG. 6B is a schematic diagram of the distribution transfer unit including independent drive electrodes aligned in the column direction that control the reading of the signal charge from the pixel region 1300 into the horizontal transfer unit 1120, in the conventional solid-state imaging device. As shown therein, the vertical transfer unit of the distribution transfer unit has the same electrode structure by every 2n+1 (n is an integer not smaller than 1) columns, and includes independent drive electrodes separated from each other in an island shape.

The transfer of the signal charge by the distribution transfer unit is controlled by a voltage applied to the distribution transfer electrode through a shunt interconnect connected thereto. As shown in FIG. 6A, a part of the shunt interconnect makes electrical connection between a bus line interconnect provided at a position beyond the horizontal transfer unit 1120 (lower portion in FIG. 6A) and the distribution transfer electrodes of the distribution transfer unit.

FIG. 7 is a plan view showing a detailed interconnect layout in the distribution transfer unit.

As shown in FIG. 7, the interconnect on the distribution transfer unit includes, unlike in the pixel region, a first interconnect 1170 (tungsten according to PTL 1) and a second interconnect 1180 (aluminum according to PTL 1). The first interconnect 1170 and the second interconnect 1180 are electrically connected through a contact at a predetermined position 1410.

Another example of power supply to the distribution transfer electrode, which serves to perform the decimation as above, can be found in PTL 2 (Japanese Unexamined Patent Application Publication No. 2008-193050) which proposes extending an interconnect over the horizontal transfer unit from the shunt interconnect provided thereon, and also extending an interconnect from the shunt interconnect on the pixel region in a vertical transfer direction.

FIG. 8 is a plan view showing a configuration of the portion around the distribution transfer unit of the conventional solid-state imaging device.

The distribution transfer unit includes a hold gate portion 117, a storage gate portion 121, and a charge storage unit VOG. Shunt interconnects 171 to 176 make electrical connection to each electrode (polysilicon of second layer in PTL 2) through contacts of interconnects 181 to 183 horizontally provided on the pixel region and interconnects 184 to 186 provided on the horizontal transfer unit.

SUMMARY OF THE INVENTION

With the techniques disclosed in PTL 1 and PTL 2, however, since the shunt interconnect is disposed over the horizontal transfer unit, a coupling capacitance emerges between transfer electrodes of the horizontal transfer unit and the shunt interconnect of the distribution transfer unit. This leads to a drawback in that a horizontal transfer drive pulse having a far higher frequency than the distribution transfer unit is coupled with the distribution transfer drive pulse as a crosstalk during a horizontal transfer period, and hence a potential of a transfer channel under the distribution transfer electrode is modulated, resulting in fluctuation of the amount of charge to be carried. Besides, the coupling capacitance increases power consumption.

Accordingly, an object of the present invention is to provide a solid-state imaging device capable of suppressing a crosstalk originating from a drive pulse applied to a horizontal transfer unit, thereby enabling correct gradation based on an amount of an incident light to be obtained.

To achieve the foregoing object, the present invention provides a solid-state imaging device, including a plurality of photoelectric conversion units arranged in a matrix on a semiconductor substrate and each configured to convert an incident light into a signal charge; a plurality of vertical transfer units provided in each row of the photoelectric conversion units and each configured to transfer the signal charge read out from the photoelectric conversion unit in a vertical direction; a horizontal transfer unit configured to transfer the signal charge in a horizontal direction; a distribution transfer unit configured to selectively transfer the signal charge from the plurality of vertical transfer units to the horizontal transfer unit; and a plurality of first light-shield layers and second light-shield layers provided on the plurality of vertical transfer units and the distribution transfer unit and configured to block a light incident on the plurality of vertical transfer units; wherein the plurality of vertical transfer units each includes a plurality of vertical transfer electrodes, and is configured to transfer the signal charge in a vertical direction in accordance with a vertical transfer pulse applied to each of the plurality of vertical transfer electrodes; the distribution transfer unit includes a plurality of distribution transfer electrodes each corresponding to each of the vertical transfer units, and is configured to selectively transfer the signal charge in accordance with a distribution transfer pulse applied to each of the plurality of distribution transfer electrodes; the plurality of first light-shield layers and the second light-shield layers are conductive; the plurality of first light-shield layers is provided in a layer different from a layer in which the second light-shield layers are provided; at least one of the plurality of first light-shield layers serves as an interconnect electrically connected to the plurality of vertical transfer electrodes included in the same row; at least one of the plurality of first light-shield layers on the distribution transfer unit serves as an interconnect electrically connected the plurality of distribution transfer electrodes; and the plurality of first light-shield layers is disposed so as not to overlap with the horizontal transfer unit.

Such a configuration enables the coupling capacitance between the plurality of first light-shield layers and the horizontal transfer unit to be suppressed. Accordingly, the crosstalk between the drive pulse and the distribution transfer pulse applied to the horizontal transfer unit arising from the coupling capacitance can be suppressed. The solid-state imaging device thus configured can therefore suppress modulation of a potential of a transfer channel under the plurality of distribution transfer electrodes caused by the crosstalk, thereby enabling correct gradation based on an amount of an incident light to be obtained. Also, suppressing thus the coupling capacitance leads to reduction in power consumption.

In addition, the second light-shield layer may include a plurality of sub light-shield layers; at least one of the plurality of sub light-shield layers on the distribution transfer unit may serve as an interconnect electrically connected to at least another one of the plurality of distribution transfer electrodes; and the plurality of sub light-shield layers may be disposed so as not to overlap with the horizontal transfer unit.

With the above configuration, the first light-shield layer and the sub light-shield layer provided on the distribution transfer unit as the interconnect for applying a distribution transfer pulse to the distribution transfer electrode can be made wider, without increasing the vertical electrode length of the distribution transfer electrode. Accordingly, the resistance of the wire for applying the distribution transfer pulse can be reduced. Such a configuration allows the solid-state imaging device to cope with an increase in frequency of the distribution transfer pulse, and to thereby operate at a higher speed.

In addition, at least one of the plurality of sub light-shield layers on the vertical transfer unit may serve as an interconnect electrically connected to the plurality of vertical transfer electrodes included in the same row.

With the above configuration, the first light-shield layer and the sub light-shield layer serving as the interconnect electrically connected to the plurality of vertical transfer electrodes can be made wider. Accordingly, the resistance of the wire for applying the vertical transfer pulse can be reduced. Such a configuration allows the solid-state imaging device to cope with an increase in frequency of the vertical transfer pulse, and to thereby operate at a higher speed.

In addition, the plurality of vertical transfer electrodes and the plurality of distribution transfer electrodes may be electrically connected to the plurality of first light-shield layers.

Such a configuration contributes to reducing the manufacturing cost.

Further, the plurality of first light-shield layers may be provided in a layer closer to the semiconductor substrate than is the second light-shield layer.

Such a configuration allows an etching margin to be reduced for forming a contact that electrically connects the distribution transfer electrode and the first light-shield layer.

Further, each of the plurality of distribution transfer electrodes may have a longer electrode length in a vertical direction than each of the plurality of vertical transfer electrodes.

Such a configuration allows the plurality of first light-shield layer provided as the interconnect on the distribution transfer unit connected to the plurality of distribution transfer electrodes to be made wider, thereby enabling the solid-state imaging device to cope with an increase in frequency of the distribution transfer pulse.

Further, the plurality of distribution transfer electrodes may be formed in a single layer structure; and the plurality of distribution transfer electrodes may have a longer electrode length in a horizontal direction than each of the plurality of vertical transfer electrodes.

Such a configuration prevents a short circuit caused by a residual interconnect between the plurality of first light-shield layers on the distribution transfer unit, because of a stepped portion on the upper surface of the distribution transfer unit. Also, the transfer channel of the distribution transfer unit can be made wider than the transfer channel of the vertical transfer unit despite increasing the horizontal electrode length of the distribution transfer electrodes because, for example, an opening for securing a region for the photoelectric conversion unit is not provided. Therefore, degradation in transfer efficiency can be prevented, by making the potential of the transfer channel of the distribution transfer unit deeper utilizing a narrow channel effect to thereby suppress decline of the transfer field.

Still further, the foregoing solid-state imaging device may further include an anti-reflection layer provided over the plurality of photoelectric conversion units and over a region between adjacent ones of the plurality of distribution transfer electrodes.

Such a configuration improves the planarity of the upper surface of the distribution transfer unit, and prevents a short circuit caused by a residual interconnect between the plurality of first light-shield layers on the distribution transfer unit, in the process of forming the plurality of first light-shield layers on the distribution transfer unit.

Thus, the solid-state imaging device according to the present invention can suppress the crosstalk originating from the drive pulse applied to the horizontal transfer unit, thereby enabling correct gradation based on an amount of an incident light to be obtained.

Further Information about Technical Background to this Application

The disclosure of Japanese Patent Application No. 2009-057769 filed on Mar. 11, 2009 including specification, drawings and claims is incorporated herein by reference in its entirety.

The disclosure of PCT Application No. PCT/JP2010/001681 filed on Mar. 10, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Figure 1:
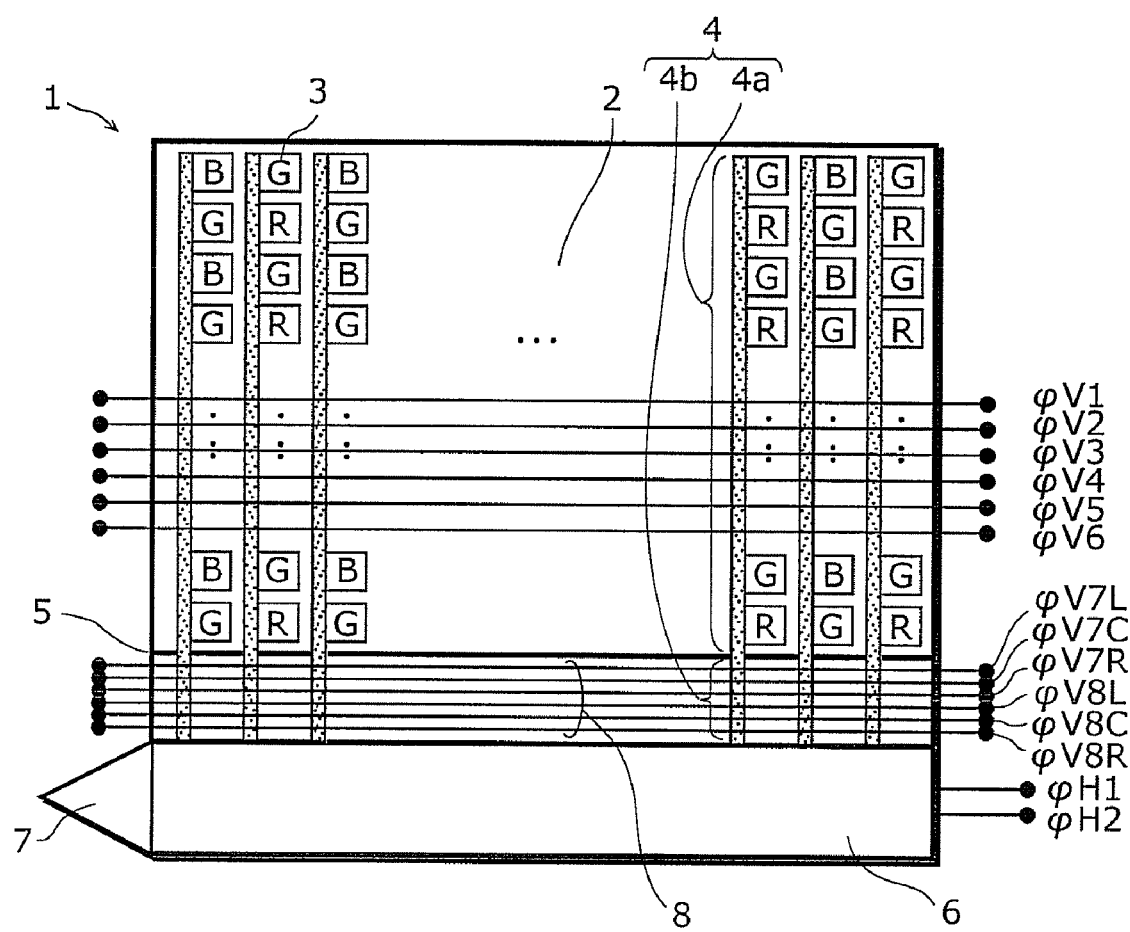
FIG. 1 is a plan view showing a general configuration of a solid-state imaging device according to a first embodiment of the present invention.

Hereafter, embodiments of the present invention will be described in details, referring to the drawings.

First Embodiment

A solid-state imaging device according to a first embodiment of the present invention includes a plurality of photoelectric conversion units arranged in a matrix on a semiconductor substrate and each configured to convert an incident light into a signal charge; a plurality of vertical transfer units provided in each row of the photoelectric conversion units and each configured to transfer the signal charge read out from the photoelectric conversion unit in a vertical direction; a horizontal transfer unit configured to transfer the signal charge in a horizontal direction; a distribution transfer unit configured to selectively transfer the signal charge from the plurality of vertical transfer units to the horizontal transfer unit; and a plurality of first light-shield layers and second light-shield layers provided on the plurality of vertical transfer units and the distribution transfer unit and configured to block an incident light on the plurality of vertical transfer units. Each of the plurality of vertical transfer units includes a plurality of vertical transfer electrodes, and is configured to transfer the signal charge in a vertical direction in accordance with a vertical transfer pulse applied to each of the plurality of vertical transfer electrodes. The distribution transfer unit includes a plurality of distribution transfer electrodes each corresponding to each of the vertical transfer units, and is configured to selectively transfer the signal charge in accordance with a distribution transfer pulse applied to each of the plurality of distribution transfer electrodes. The plurality of first light-shield layers and the second light-shield layers are conductive. The plurality of first light-shield layers is provided in a layer different from a layer in which the second light-shield layers are provided. At least one of the plurality of first light-shield layers serves as an interconnect electrically connected to the plurality of vertical transfer electrodes included in the same row, and at least one of the plurality of first light-shield layers on the distribution transfer unit serves as an interconnect electrically connected the plurality of distribution transfer electrodes. The plurality of first light-shield layers is disposed so as not to overlap with the horizontal transfer unit.

With such a configuration, the solid-state imaging device according to this embodiment can suppress the crosstalk originating from the drive pulse applied to the horizontal transfer unit, thereby enabling correct gradation based on an amount of an incident light to be obtained.

FIG. 1 is a plan view showing a general configuration of the solid-state imaging device according to the first embodiment of the present invention.

As shown in FIG. 1, the solid-state imaging device 1 according to this embodiment includes a pixel region 2, a distribution transfer unit 5, a horizontal transfer unit 6, an output unit 7, and a shunt interconnect 8.

The pixel region 2 includes a plurality of two-dimensionally arranged photoelectric conversion units 3, and vertical transfer channels 4 that each transfer a signal charge read out from the photoelectric conversion unit 3 in a vertical direction (downward in FIG. 1), located adjacent to each photoelectric conversion unit 3.

The photoelectric conversion unit 3, which may include a photo diode, serves to convert an incident light into a signal charge. Although not shown, the photoelectric conversion unit 3 is provided on a semiconductor substrate (for example, an n-type silicon substrate). In each of the photoelectric conversion units 3, three color filters of red (R), green (G), and blue (B) are arranged. In this embodiment, each of the RGB filters is regularly provided at every third pixel in vertical and horizontal directions.

The vertical transfer channel 4 is an n-type diffusion layer formed on a front surface of the semiconductor substrate (not shown). The vertical transfer channel 4 undergoes a fluctuation in potential, in this embodiment depending on a drive pulse $\phi V1$ to $\phi V6$ and a distribution transfer pulse $\phi V7L$, $\phi V7C$, $\phi V7R$, $\phi V8L$, $\phi V8C$ and $\phi V8R$ applied to the 6-phase drive vertical transfer electrodes V1 to V6 and the distribution transfer electrodes V7L, V7C, V7R, V8L, V8C, and V8R. The vertical transfer channel 4 includes a first sub-transfer channel 4a located in the pixel region 2 and a second sub-transfer channel 4b located in the distribution transfer unit 5. Thus, the first sub-transfer channel 4a and the vertical transfer electrodes V1 to V6 correspond to the vertical transfer unit according to the present invention, and serve to transfer a signal charge read out from the photoelectric conversion unit 3 in a vertical direction, in accordance with the drive pulse $\phi V1$ to $\phi V6$.

The distribution transfer unit 5 selectively transfers a signal charge transferred from the pixel region 2 to the horizontal transfer unit 6. The distribution transfer unit 5 includes the distribution transfer electrodes V7L, V7C, V7R, V8L, V8C, and V8R, and a second sub-transfer channel 4b. More specifically, the distribution transfer unit 5 selectively transfers the signal charge transferred from the pixel region 2 to the horizontal transfer unit 6, in accordance with the distribution transfer pulse $\phi V7L$, $\phi V7C$, $\phi V7R$, $\phi V8L$, $\phi V8C$, and $\phi V8R$ applied through the shunt interconnect 8 to the distribution transfer electrodes V7L, V7C, V7R, V8L, V8C, and V8R. Here, the drive pulse φV1 to φV6 correspond to the vertical transfer pulse according to the present invention, and the distribution transfer pulse φV7L, φV7C, φV7R, φV8L, φV8C, and φV8R correspond to the distribution transfer pulse according to the present invention.

The horizontal transfer unit 6 may perform a two-phase drive for example, and transfers the signal charge transferred from the distribution transfer unit 5 in a horizontal direction, in accordance with the horizontal transfer pulse φH1 and φH2.

The output unit 7 converts the signal charge transferred from the horizontal transfer unit 6 into a voltage, and outputs the voltage.

The shunt interconnect 8 serves to apply the distribution transfer pulse φV7L, φV7C, φV7R, φV8L, φV8C, and φV8R to the distribution transfer unit 5, and is routed only on the distribution transfer unit 5 without passing over the horizontal transfer unit 6. In other words, the shunt interconnect 8 is routed on the distribution transfer unit 5 in a horizontal direction, without overlapping with the horizontal transfer unit 6.

The configuration of the solid-state imaging device 1 according to this embodiment will be described in further details.

Figure 2:
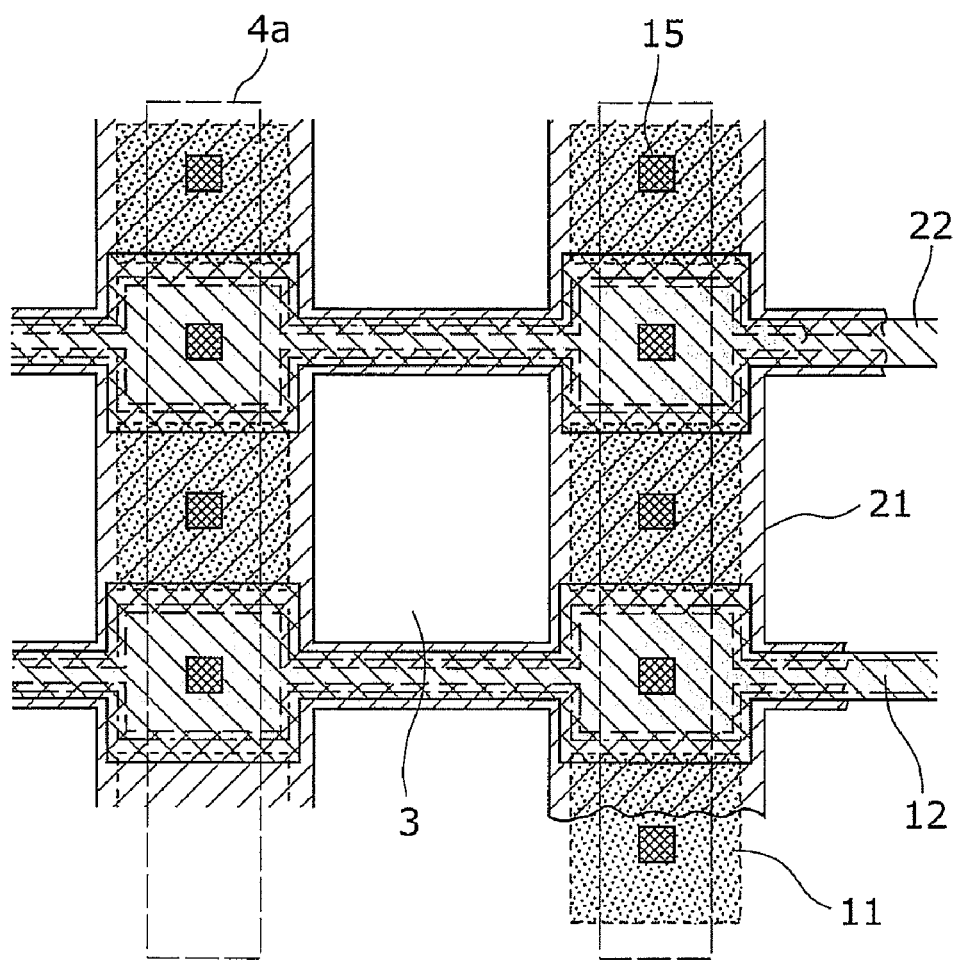
FIG. 2 is an enlarged plan view showing a layout example of a pixel region.

FIG. 2 is an enlarged plan view showing a layout example of the pixel region.

As shown in FIG. 2, a plurality of vertical transfer electrodes 11, 12 formed in a single layer is located on the first sub-transfer channel 4a. Specifically, two vertical transfer electrodes 11, 12 are provided per unit pixel on the first sub-transfer channel 4a in FIG. 2. The vertical transfer electrodes 11, 12 may be constituted of a conductive layer such as a single-layer polysilicon (also the case with the distribution transfer electrodes V7L, V7C, V7R, V8L, V8C, and V8R of the distribution transfer unit 5, and the horizontal transfer electrodes of the horizontal transfer unit 6). Also, a first light-shield layer 21 and a second light-shield layer 22, which are conductive, are provided over the vertical transfer electrodes 11, 12 with an insulating layer (not shown) therebetween.

The first light-shield layer 21 and the second light-shield layer 22 may be formed of a light-shielding metal thin film such as tungsten, deposited by a CVD process or a sputtering process. In the example shown in FIG. 2, the second light-shield layer 22 is located at an upper position of the first light-shield layer 21, and the first light-shield layer 21 and the second light-shield layer 22 serve to block a light to the first sub-transfer channel 4a, and also serve as interconnects for applying the drive pulse φV1 to φV6 to the vertical transfer electrodes 11, 12.

The first light-shield layer 21 is disposed in a grid pattern in a horizontal direction so as not to overlap with the photoelectric conversion unit 3, and connected through a contact 15 to the vertical transfer electrode 11 adjacent to the photoelectric conversion unit 3. The second light-shield layer 22 is located in an upper layer of a region spaced from the first light-shield layer 21, and connected through the contact 15 to the vertical transfer electrode 12 spaced from the photoelectric conversion unit 3. In other words, the first light-shield layer 21 is provided so as to serve as an interconnect electrically connected to the vertical transfer electrodes 11 included in the same row, and the second light-shield layer 22 is provided so as to serve as an interconnect electrically connected to the vertical transfer electrodes 12 included in the same row.

The vertical transfer electrodes 11, 12 correspond to the vertical transfer electrodes V1 to V6. Hereinafter, the vertical transfer electrodes adjacent to the photoelectric conversion unit 3 will be referred to as vertical transfer electrode 11, and the vertical transfer electrodes spaced from the photoelectric conversion unit 3 will be referred to as vertical transfer electrode 12, without specific distinction of the vertical transfer electrodes V1 to V6.

The first light-shield layer 21 electrically connected to the vertical transfer electrodes 11 included in a row and the first light-shield layer 21 electrically connected to the vertical transfer electrodes 11 included in another row are formed independently from each other. Likewise, the second light-shield layer 22 electrically connected to the vertical transfer electrodes 12 included in a row and the second light-shield layer 22 electrically connected to the vertical transfer electrodes 12 included in another row are formed independently from each other.

Hereunder, an example where the first light-shield layer 21 and the second light-shield layer 22 serve as the shunt interconnect 8 on the distribution transfer unit 5 will be described.

Figure 3:
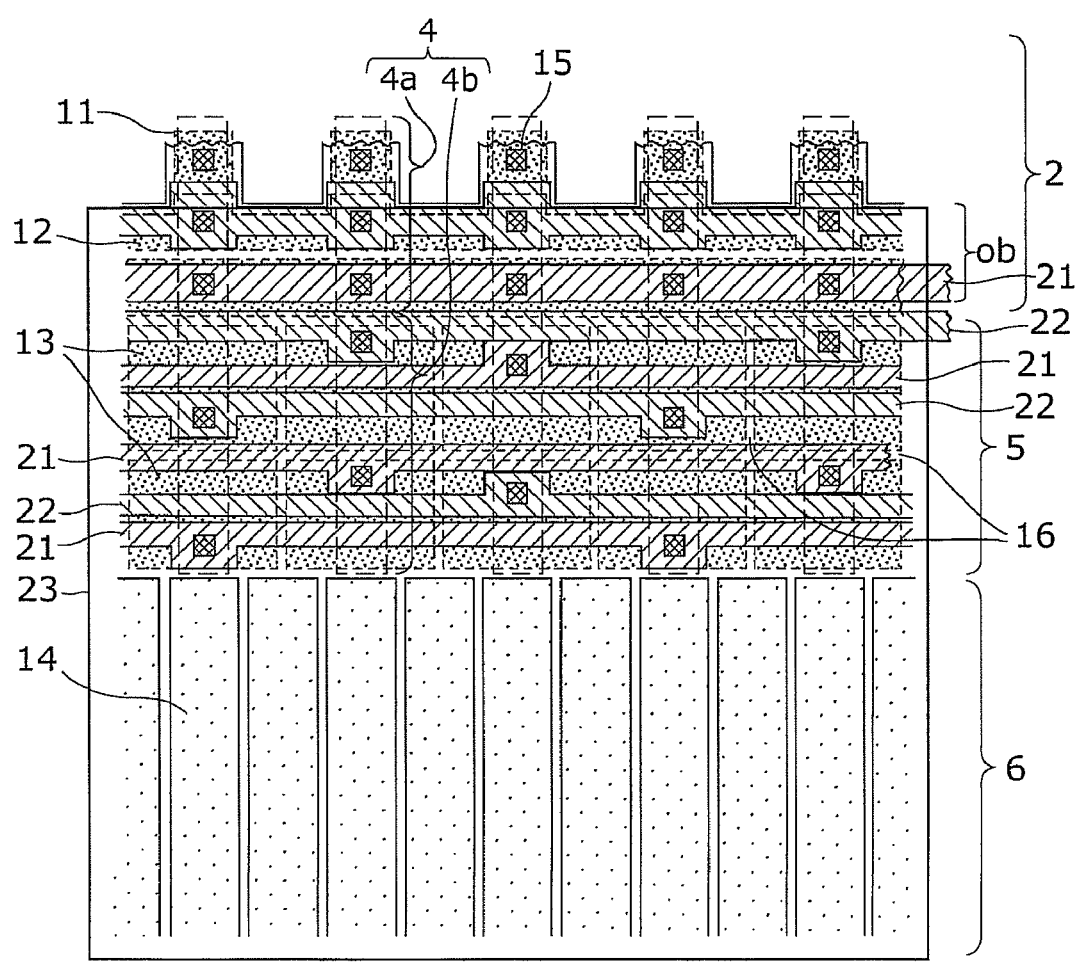
FIG. 3 is an enlarged plan view showing a layout example of a distribution transfer unit.

FIG. 3 is an enlarged plan view showing a layout example of the distribution transfer unit 5 of the solid-state imaging device 1 according to this embodiment.

As shown in FIG. 3, the distribution transfer unit 5 includes a plurality of distribution transfer electrodes 13. The plurality of distribution transfer electrodes 13 corresponds to the distribution transfer electrodes V7L, V7C, V7R, V8L, V8C, and V8R. Hereinafter, these electrodes will be simply referred to as distribution transfer electrode 13, where specific distinction of the distribution transfer electrodes V7L, V7C, V7R, V8L, V8C, and V8R is not necessary.

The first light-shield layer 21 on the distribution transfer unit 5 is provided as an interconnect electrically connected to at least one of the plurality of distribution transfer electrodes 13 through the contact 15. Likewise, the second light-shield layer 22 on the distribution transfer unit 5 is provided as an interconnect electrically connected to at least another one of the plurality of distribution transfer electrodes 13 through the contact 15. Thus, the first light-shield layer 21 and the second light-shield layer 22 on the distribution transfer unit 5 respectively serve as the shunt interconnect 8 shown in FIG. 1.

The horizontal transfer unit 6 includes a plurality of horizontal transfer electrodes 14 aligned in a horizontal direction, and transfers a signal charge in a horizontal direction in accordance with the horizontal transfer pulse φH1 and φH2 applied to the horizontal transfer electrodes 14.

Here, the first light-shield layer 21 and the second light-shield layer 22 are disposed so as not to overlap with the horizontal transfer unit 6.

With such a configuration, the solid-state imaging device 1 according to this embodiment can suppress a coupling capacitance between the first light-shield layer 21 and the second light-shield layer 22 which are the shunt interconnect 8 on the distribution transfer unit 5 and the horizontal transfer electrode 14. Accordingly, the crosstalk between the horizontal transfer pulse φH1 and φH2 and the distribution transfer pulse φV7L, φV7C, φV7R, φV8L, φV8C, and φV8R arising from the coupling capacitance can be suppressed. Therefore, modulation of a potential of the second sub-transfer channel 4b of the distribution transfer unit 5 caused by the crosstalk can be suppressed, and correct gradation based on an amount of an incident light can be obtained.

Also, suppressing thus the coupling capacitance leads to reduction in power consumption of the solid-state imaging device 1 according to this embodiment.

Here, two of the distribution transfer electrodes 13 are vertically aligned on the respective second sub-transfer channel 4b.

To independently control the distribution transfer electrodes 13 by a plurality of columns with the distribution transfer pulse φV7L, φV7C, φV7R, φV8L, φV8C, and φV8R under such a configuration, the first light-shield layer 21 and the second light-shield layer 22 provided on the distribution transfer unit 5 have to be formed on two vertically aligned distribution transfer electrodes 13.

In the case where the vertical electrode length of the distribution transfer electrodes 13 and the vertical electrode length of the vertical transfer electrodes 11, 12 are the same, the interconnect density of the first light-shield layer 21 and the second light-shield layer 22 provided on one of the distribution transfer electrodes 13 becomes higher than the interconnect density of the first light-shield layer 21 and the second light-shield layer 22 provided on one of the vertical transfer electrodes 11, 12.

Referring to the example shown in FIG. 3, since the distribution transfer unit 5 includes a large number of independent distribution transfer electrodes 13, the distribution transfer unit 5 requires a space (vertical electrode length) corresponding to three interconnects per row (per transfer electrode). For this reason, the vertical electrode length of the distribution transfer electrodes 13 is longer than the vertical electrode length of the vertical transfer electrodes 11, 12.

Such a configuration allows the first light-shield layer 21 and the second light-shield layer 22 on the distribution transfer unit 5 to be formed as a wider interconnect, thereby enabling the distribution transfer pulse φV7L, φV7C, φV7R, φV8L, φV8C, and φV8R of a higher frequency to be handled. In other words, the solid state imaging device 1 according to this embodiment can operate at a higher speed.

Also, the material of the first light-shield layer 21 on the distribution transfer unit 5 is the same as the material of the first light-shield layer 21 on the pixel region 2, and the material of the second light-shield layer 22 on the distribution transfer unit 5 is the same as the material of the second light-shield layer 22 on the pixel region 2. For example, tungsten may be employed as the material of the first light-shield layer 21 and the second light-shield layer 22.

Such a configuration allows the shunt interconnect 8 to be formed without the need to form an additional interconnect layer, thereby facilitating the manufacturing of the solid-state imaging device 1.

Now, as shown in FIG. 3, the solid-state imaging device 1 according to this embodiment further includes a light-shield layer 23 provided over an optically black (OB) region ob of the pixel region 2, the distribution transfer unit 5, and the horizontal transfer unit 6, for blocking a light incident on the OB region, the distribution transfer unit 5, and the horizontal transfer unit 6.

Figure 7:
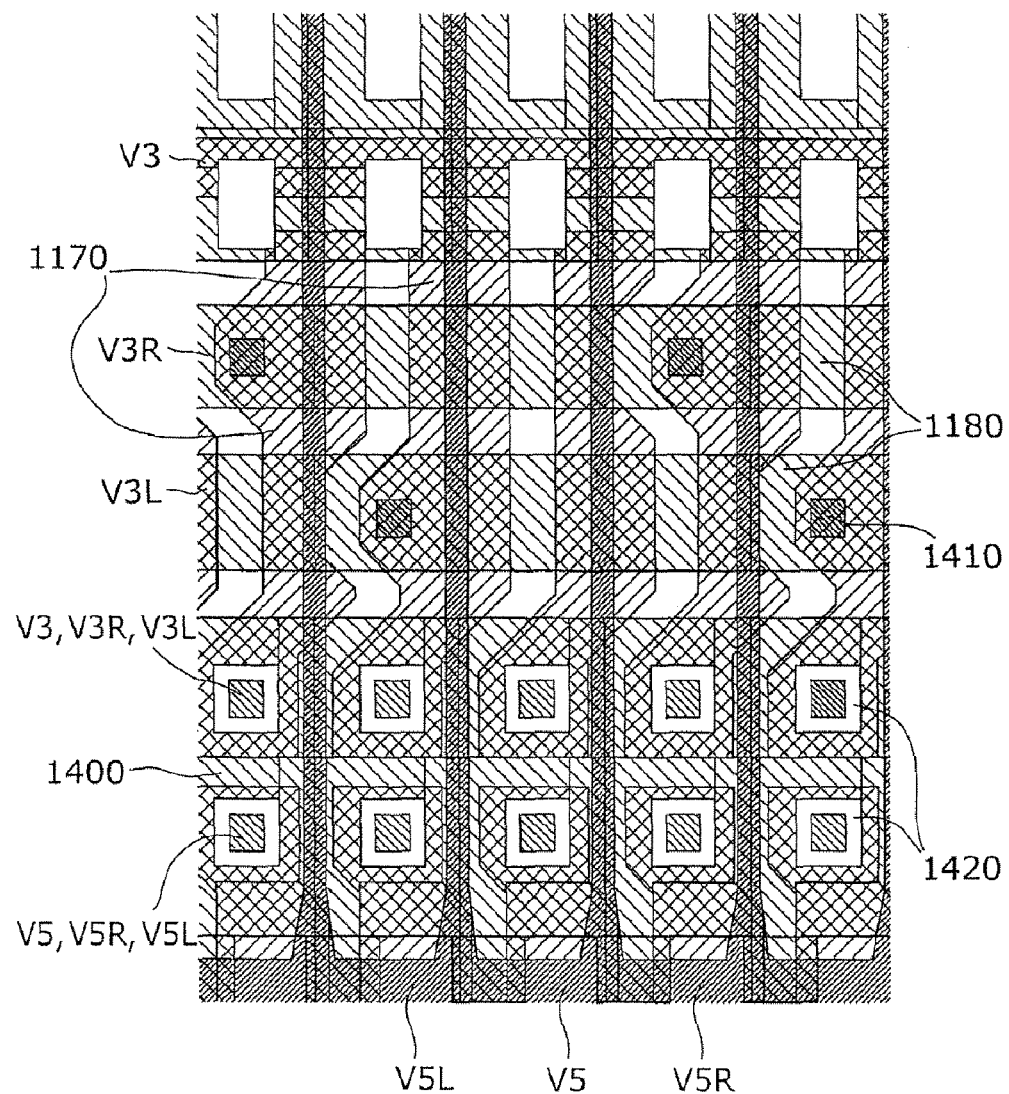
FIG. 7 is a plan view showing a detailed interconnect layout in the distribution transfer unit.
Figure 8:
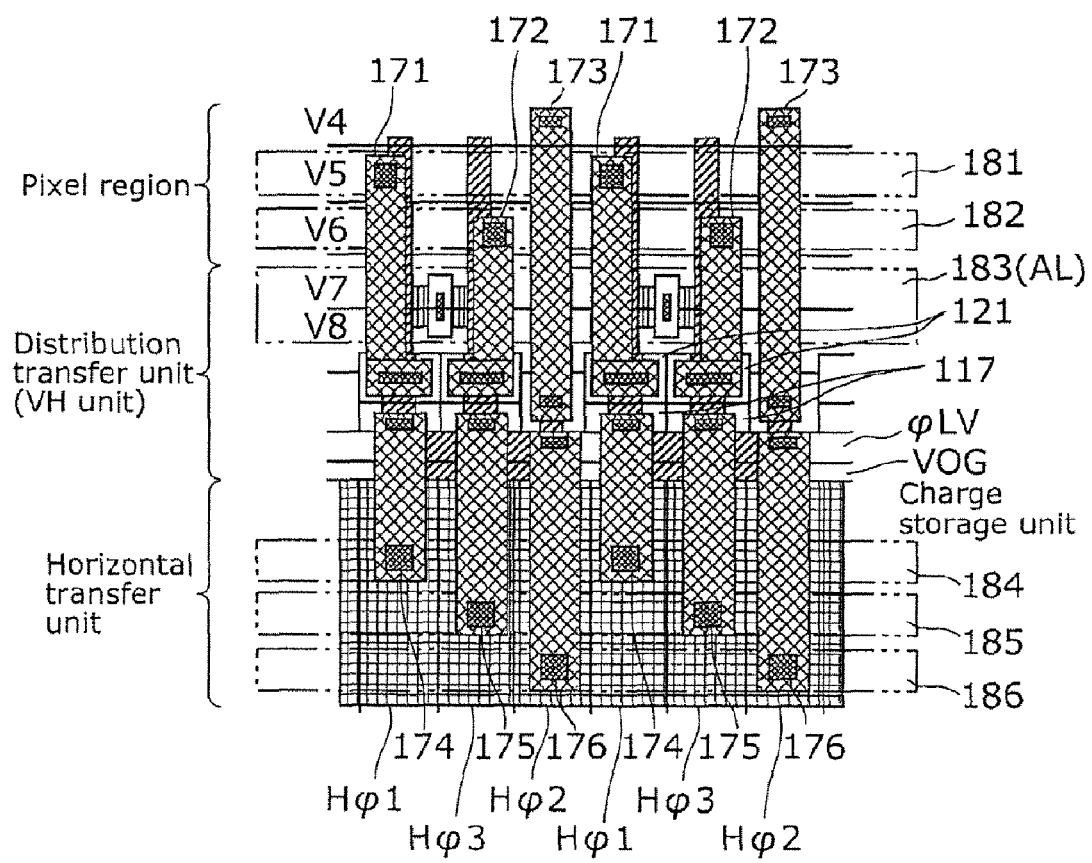
FIG. 8 is a plan view showing a configuration of the portion around the distribution transfer unit of the conventional solid-state imaging device.

The solid-state imaging device according to PTL 1 employs a material (aluminum) of the light-shield layer for the OB region to constitute the interconnect of the distribution transfer unit, and employs another light-shield layer than that for the OB region to cover the distribution transfer unit. Accordingly, a contact window has to be provided for the contact to pass therethrough in the light-shield layer 1400 on the distribution transfer unit, for example at a predetermined position 1420 shown in FIG. 7. Such a configuration leads to a drawback in that an incident light leaking through the contact window creates a smear.

In contrast, in the solid-state imaging device 1 according to this embodiment, the first light-shield layer 21 and the second light-shield layer 22 provided over the distribution transfer unit 5, which are the same structure as the first light-shield layer 21 and the second light-shield layer 22 provided over the pixel region 2, are utilized as the shunt interconnect 8. Such an arrangement eliminates the need to employ the aluminum used as the light-shield layer for the OB region to form the shunt interconnect 8 on the distribution transfer unit 5, as the solid-state imaging device according to PTL 1. Accordingly, the light-shield layer 23 can be provided over the distribution transfer unit 5 as over the OB region, and an incident light can be prevented from leaking into the second sub-transfer channel 4b in the distribution transfer unit 5.

Thus, the solid-state imaging device 1 according to this embodiment can suppress appearance of a smear thereby achieving excellent optical characteristics.

It is preferable that the distribution transfer unit 5 does not include an opening except for gaps 16 between the distribution transfer electrodes 13. In other words, it is preferable that the horizontal electrode length of the distribution transfer electrodes 13 is longer than that of the vertical transfer electrodes 11, 12. Further, it is preferable to extend the horizontal electrode length of the distribution transfer electrodes 13 as much as possible. This is because such a configuration prevents a short circuit caused by a residual interconnect between adjacent lines of the shunt interconnect 8 aligned in a horizontal direction, because of a stepped portion that may be formed in the case where an opening is present in the distribution transfer unit 5. Also, the second sub-transfer channel 4b can be made wider than the first sub-transfer channel 4a despite increasing the horizontal electrode length of the distribution transfer electrodes 13 because, for example, an opening for securing a region for the photoelectric conversion unit is not provided. Therefore, degradation in transfer efficiency can be prevented, by making the potential of the second sub-transfer channel 4b deeper utilizing a narrow channel effect to thereby suppress decline of the transfer field.

Also, it is preferable to provide an anti-reflection layer used in the pixel region 2 on the gaps 16 between the distribution transfer electrodes 13 in the distribution transfer unit 5. In other words, it is preferable that the solid-state imaging device 1 includes an anti-reflection layer located between the photoelectric conversion units 3 and the adjacent distribution transfer electrodes 13. Such a configuration improves the planarity of the portion over the gaps 16 of the distribution transfer unit 5 utilizing the existing layer without the need to add an extra process, and prevents a short circuit caused by a residual interconnect between adjacent lines of the shunt interconnect 8 that is prone to be produced in the process of forming the shunt interconnect 8 over the gaps 16.

Thus, the solid-state imaging device 1 according to this embodiment includes the plurality of photoelectric conversion units 3 arranged in a matrix on the semiconductor substrate and each configured to convert an incident light into a signal charge; the plurality of vertical transfer units provided in each row of the photoelectric conversion units 3 and each configured to transfer the signal charge read out from the photoelectric conversion unit 3 in a vertical direction; the horizontal transfer unit 6 configured to transfer the signal charge in a horizontal direction; the distribution transfer unit 5 configured to selectively transfer the signal charge from the plurality of vertical transfer units to the horizontal transfer unit 6; and the plurality of first light-shield layers 21 and second light-shield layers 22 provided on the plurality of vertical transfer units and the distribution transfer unit 5 and configured to block a light incident on the plurality of first sub-transfer channel 4a. Each of the plurality of vertical transfer units includes the plurality of vertical transfer electrodes 11, 12, and is configured to transfer the signal charge in a vertical direction in accordance with the drive pulse φV1 to φV6 applied to each of the plurality of vertical transfer electrodes. The distribution transfer unit 5 includes the plurality of distribution transfer electrodes 13 each corresponding to each of the vertical transfer units, and is configured to selectively transfer the signal charge in accordance with the distribution transfer pulse φV7L, φV7C, φV7R, φV8L, φV8C, and φV8R applied to each of the plurality of distribution transfer electrodes 13. The plurality of first light-shield layers 21 and the second light-shield layers 22 are conductive. The plurality of first light-shield layers 21 is provided in the layer different from the layer in which the second light-shield layers 22 are provided. At least one of the plurality of first light-shield layers 21 serves as an interconnect electrically connected to the plurality of vertical transfer electrodes 11 included in the same row, and at least one of the plurality of first light-shield layers 21 on the distribution transfer unit 5 serves as an interconnect electrically connected at least one of the plurality of distribution transfer electrodes 13. The plurality of first light-shield layers 21 is disposed so as not to overlap with the horizontal transfer unit 6.

The solid-state imaging device 1 thus configured according to this embodiment can suppress a crosstalk arising from the horizontal transfer pulse φH1 and φH2, thereby enabling correct gradation based on an amount of an incident light to be obtained. In other words, a crosstalk between the shunt interconnect 8 and the horizontal transfer electrode 14 can be suppressed. Also, suppressing thus the crosstalk leads to reduction in power consumption.

Also, the plurality of second light-shield layers 22 on the distribution transfer unit 5 serves as the shunt interconnect 8 electrically connected to at least another one of the plurality of distribution transfer electrodes 13.

With the above configuration, the shunt interconnect 8 connected to the distribution transfer electrode 13 can be made wider. Accordingly, the resistance of the shunt interconnect 8 can be reduced. Such a configuration allows the solid-state imaging device 1 to cope with an increase in frequency of the distribution transfer pulse φV7L, φV7C, φV7R, φV8L, φV8C, and φV8R, and to thereby operate at a higher speed.

Also, the plurality of second light-shield layers 22 on the pixel region 2 serves as an interconnect electrically connected to the vertical transfer electrodes 12 included in the same row.

With the above configuration, since the vertical transfer electrode 11 and the vertical transfer electrode 12 are respectively connected to a different light-shield layer, the interconnect connected to the vertical transfer electrode 11 and the interconnect connected to the vertical transfer electrode 12 can be made wider. Accordingly, the interconnect resistance can be reduced. Such a configuration allows the solid-state imaging device to cope with an increase in frequency of the drive pulse φV1 to φV6, and to thereby operate at a higher speed. Here, the second light-shield layer 22 according to this embodiment corresponds to the sub light-shield layer according to the present invention.

Second Embodiment

A solid-state imaging device according to a second embodiment is generally the same as the solid-state imaging device 1 according to the first embodiment, except that the vertical transfer electrodes 11, 12 and the distribution transfer electrodes 13 are electrically connected to the first light-shield layer.

Figure 4:
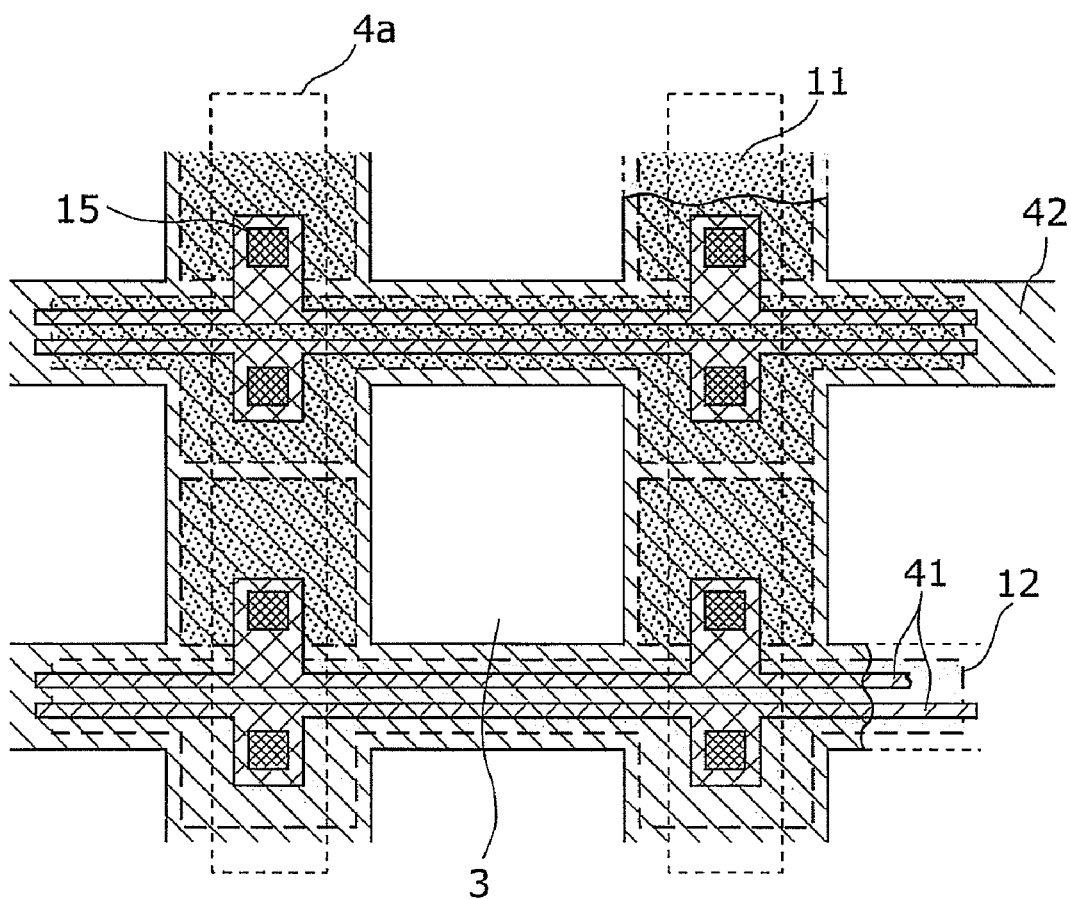
FIG. 4 is an enlarged plan view showing a layout example of a pixel region of a solid-state imaging device according to a second embodiment of the present invention.
Figure 5:
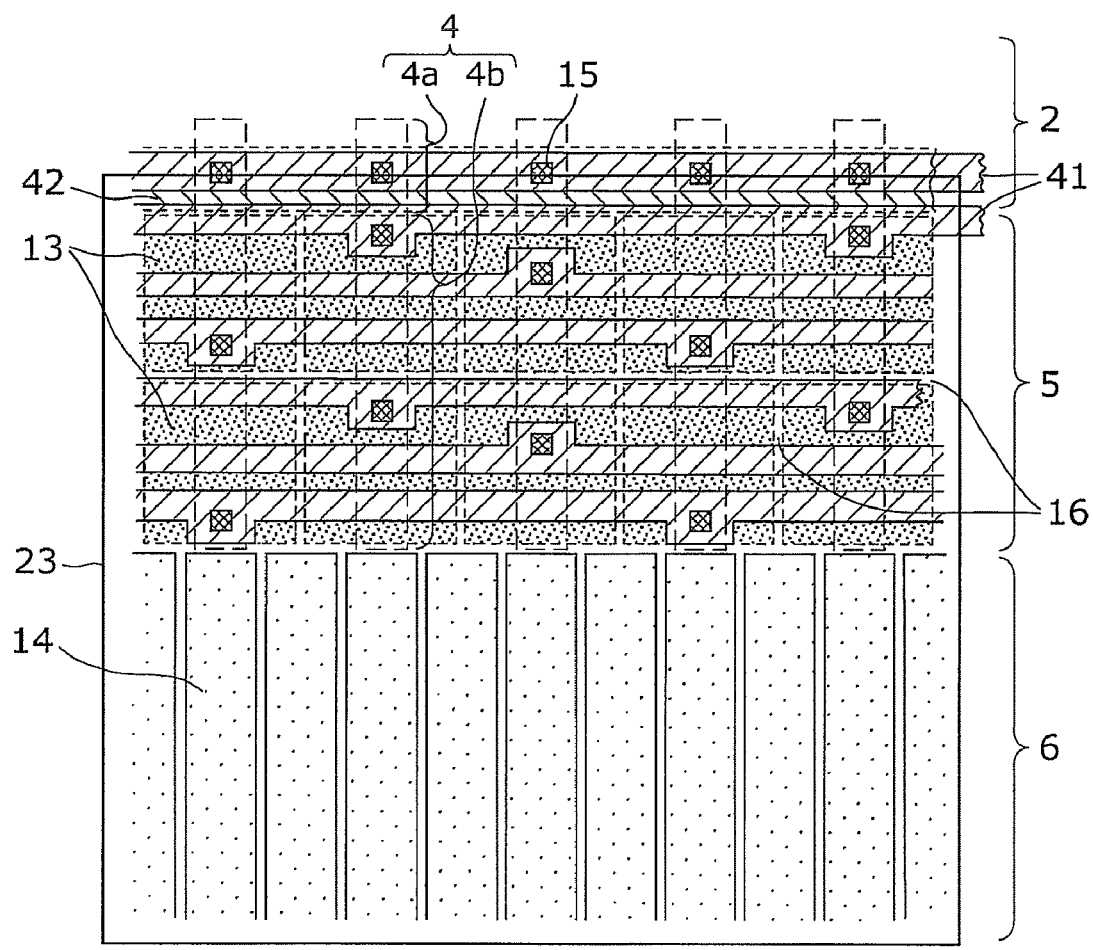
FIG. 5 is an enlarged plan view showing another layout example of a distribution transfer unit.
Figures 6A, 6B:
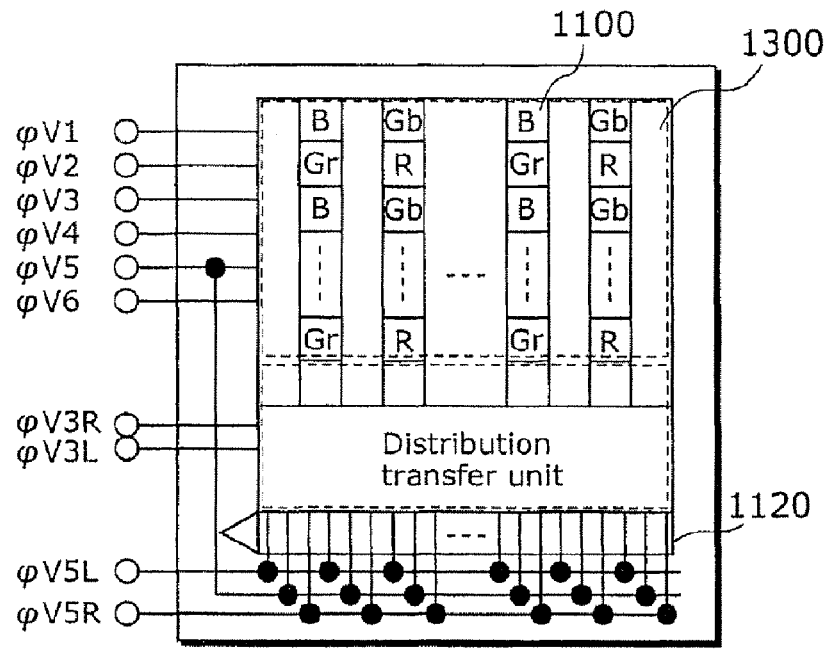
FIG. 6A is a schematic plan view showing a configuration of a conventional solid-state imaging device.
FIG. 6B is a diagram showing a general configuration of a distribution transfer unit.

Referring now to FIGS. 1, 4, and 5, the solid-state imaging device according to the second embodiment of the present invention will be described hereunder.

The solid-state imaging device according to this embodiment is similarly configured to the solid-state imaging device 1 according to the first embodiment, in which the shunt interconnect 8 connected to the distribution transfer unit 5 is disposed so as not to overlap with the horizontal transfer unit 6, and hence the description based on FIG. 1 will not be repeated. Hereafter, differences from the first embodiment will be specifically described.

Although the solid-state imaging device according to this embodiment is generally the same as the solid-state imaging device 1 according to the first embodiment, the former is different from the latter in that only one of the first light-shield layer and the second light-shield layer serves as the shunt interconnect that applies the drive pulse φV1 to φV6 to the vertical transfer electrode, in the pixel region 2. In other words, the other one serves only as a light-shield layer.

With respect to the distribution transfer unit 5 also, only one of the first light-shield layer and the second light-shield layer serves as the shunt interconnect 8.

FIG. 4 is an enlarged plan view showing a layout example of the pixel region of the solid-state imaging device according to this embodiment.

As shown in FIG. 4, a first light-shield layer 41 and a second light-shield layer 42 are provided over the pixel region 2 of the solid-state imaging device according to this embodiment, in place of the first light-shield layer 21 and the second light-shield layer 22 shown in FIG. 2.

The first light-shield layer 41 and the second light-shield layer 42 equally block a light incident on the first sub-transfer channel 4a, as the first light-shield layer 21 and the second light-shield layer 22 shown in FIG. 2. However, the first light-shield layer 41 is further electrically connected to the vertical transfer electrodes 12 unlike the first light-shield layer 21, and the second light-shield layer 42 is not electrically connected to the vertical transfer electrodes 12 unlike the second light-shield layer 22, and only serves as a light-shield layer that blocks a light incident on the first sub-transfer channel 4a. Thus, the first light-shield layer 41 serves as an interconnect electrically connected to the vertical transfer electrodes 11 and the vertical transfer electrodes 12 included in the same row. In other words, the drive pulse φV1 to φV6 is applied to the vertical transfer electrodes 11 and the vertical transfer electrodes 12 in the pixel region 2 through the first light-shield layer 41.

For example, making the first light-shield layer 41 serving as the interconnect narrower as shown in FIG. 4 than the first light-shield layer 21 shown in FIG. 2 enables the interconnect to be formed in a single layer, despite the vertical transfer electrodes 11 and the vertical transfer electrodes 12 being provided per unit pixel, and the second light-shield layer 42 can be provided so as to only serve as a light-shield layer. Also, in the case where just one vertical transfer electrode is provided on the first sub-transfer channel 4a per unit pixel, the interconnect density becomes lower than in the case where two vertical transfer electrodes 11, 12 are provided as shown in FIG. 2, which further facilitates the formation of the interconnect from a single light-shield layer in the pixel region.

Hereunder, an example where the first light-shield layer 41 serves as the shunt interconnect 8 will be described.

FIG. 5 is an enlarged plan view showing another layout example of the distribution transfer unit 5. The same constituents as those shown in FIG. 3 will be given the same numeral, and the description thereof will not be repeated.

The distribution transfer unit 5 is configured to perform in the same way as in the first embodiment, except that the shunt interconnect 8 for supplying power to the distribution transfer electrode 13 is constituted only of the first light-shield layer 41, i.e., of a single layer.

On the assumption that the distribution transfer unit 5 is configured to perform in the same way as in the first embodiment, the first light-shield layer 41 on the distribution transfer unit 5 may be made narrower as the first light-shield layer 41 serving as the interconnect for the pixel region 2, or the electrode length of the distribution transfer electrodes 13 may be increased compared with those of the first embodiment, in order to form the shunt interconnect 8 only from the first light-shield layer 41. In other words, forming the distribution transfer electrodes 13 of the solid-state imaging device according to this embodiment in a longer vertical electrode length than the distribution transfer electrodes 13 of the solid-state imaging device 1 according to the first embodiment allows the shunt interconnect 8 to be formed.

From another viewpoint, since the entire shunt interconnect 8 is formed in the same layer in the solid-state imaging device according to this embodiment, a larger margin has to be secured between the lines of the shunt interconnect 8, in order to form the shunt interconnect 8 of the solid-state imaging device according to this embodiment in the same width as the shunt interconnect 8 of the solid-state imaging device 1 according to the first embodiment. For such a reason, the distribution transfer electrodes 13 of the solid-state imaging device according to this embodiment have to be formed in a longer vertical electrode length than the distribution transfer electrodes 13 of the solid-state imaging device 1 according to the first embodiment, in which the shunt interconnect 8 is formed in two layers.

Also, forming thus the shunt interconnect 8 only in a single layer (first light-shield layer 41) eliminates the need to provide the contact 15 for connecting the second light-shield layer 42 and the distribution transfer electrode 13, unlike the first embodiment in which the shunt interconnect 8 is formed in two layers (first light-shield layer 21 and second light-shield layer 22), since the second light-shield layer 42 is not configured to serve as the shunt interconnect 8, but only as a light-shield layer.

Consequently, the solid-state imaging device according to this embodiment allows simplification of the manufacturing process thereby reducing the manufacturing cost, compared with the solid-state imaging device 1 according to the first embodiment in which the shunt interconnect 8 is formed in two layers.

The first light-shield layer 41 is formed in a layer closer to the semiconductor substrate than is the second light-shield layer 42. In other words, the first light-shield layer 41 is located at a lower level than the second light-shield layer 42, and hence the etching margin for forming the contact for connection to the first light-shield layer 41 may be reduced compared with the etching margin for forming the contact for connection to the second light-shield layer 42. Therefore, the solid-state imaging device according to this embodiment allows a larger region to be secured for forming the shunt interconnect 8 than in the solid-state imaging device 1 according to the first embodiment.

Also, it is distribution that the distribution transfer unit 5 does not include an opening except for the gaps 16 between the distribution transfer electrodes 13. This is because such a configuration prevents a short circuit caused by a residual interconnect between adjacent lines of the shunt interconnect 8 aligned in a horizontal direction, because of a stepped portion that may be formed in the case where an opening is present in the distribution transfer unit 5. Also, the second sub-transfer channel 4b can be made wider than the first sub-transfer channel 4a despite increasing the horizontal electrode length of the distribution transfer electrodes 13, because no opening is provided. Therefore, degradation in transfer efficiency can be prevented, by making the potential of the second sub-transfer channel 4b deeper utilizing a narrow channel effect to thereby suppress decline of the transfer field.

Also, it is preferable to provide the anti-reflection layer used in the pixel region 2 on the gaps 16 between the distribution transfer electrodes 13 in the distribution transfer unit 5. Such a configuration improves the planarity of the portion over the gaps 16 of the distribution transfer unit 5 without the need to add an extra process, and prevents a short circuit caused by a residual interconnect between adjacent lines of the shunt interconnect 8 that is prone to be produced in the process of forming the shunt interconnect 8 over the gaps 16, as in the first embodiment.

Thus, the solid-state imaging device according to this embodiment includes the plurality of first light-shield layers 41 electrically connected to the vertical transfer electrodes 11 and the vertical transfer electrodes 12 included in the same row, and the second light-shield layer 42 that blocks a light incident on the first sub-transfer channel 4a, in place of the first light-shield layer 21 and the second light-shield layer 22 of the solid-state imaging device 1 according to the first embodiment. Accordingly, the drive pulse $\phi V1$ to $\phi V6$ is applied to the vertical transfer electrodes 11 and the vertical transfer electrodes 12 through the first light-shield layers 41.

Further, in the solid-state imaging device according to this embodiment, the plurality of distribution transfer electrodes 13 is electrically connected to the first light-shield layers 41. Accordingly, the distribution transfer pulse $\phi V7L$, $\phi V7C$, $\phi V7R$, $\phi V8L$, $\phi V8C$, and $\phi V8R$ is applied to the distribution transfer electrodes 13 through the first light-shield layers 41.

The solid-state imaging device according to this embodiment thus configured can be manufactured at a still lower cost than the solid-state imaging device 1 according to the first embodiment.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is suitably applicable to a solid-state imaging device incorporated in, for example, a digital still camera.

What is claimed is:

1. A solid-state imaging device comprising:
    a plurality of photoelectric conversion units arranged in a matrix on a semiconductor substrate and each configured to convert an incident light into a signal charge;
    a plurality of vertical transfer units provided in each row of said photoelectric conversion units and each configured to transfer the signal charge read out from said photoelectric conversion unit in a vertical direction;
    a horizontal transfer unit configured to transfer the signal charge in a horizontal direction;
    a distribution transfer unit configured to selectively transfer the signal charge from said plurality of vertical transfer units to said horizontal transfer unit; and
    a plurality of first light-shield layers and second light-shield layers provided on said plurality of vertical transfer units and said distribution transfer unit and configured to block a light incident on said plurality of vertical transfer units;

wherein said plurality of vertical transfer units each includes a plurality of vertical transfer electrodes, and is configured to transfer the signal charge in a vertical direction in accordance with a vertical transfer pulse applied to each of the plurality of vertical transfer electrodes;

said distribution transfer unit includes a plurality of distribution transfer electrodes each corresponding to each of said vertical transfer units, and is configured to selectively transfer the signal charge in accordance with a distribution transfer pulse applied to each of the plurality of distribution transfer electrodes;

said plurality of first light-shield layers and said second light-shield layers are conductive;

said plurality of first light-shield layers is provided in a layer different from a layer in which said second light-shield layers are provided;

at least one of said plurality of first light-shield layers serves as an interconnect electrically connected to the plurality of vertical transfer electrodes included in the same row;

at least one of said plurality of first light-shield layers on said distribution transfer unit serves as an interconnect electrically connected the plurality of distribution transfer electrodes; and said plurality of first light-shield layers is disposed so as not to overlap with said horizontal transfer unit.

2. The solid-state imaging device according to claim 1, wherein said second light-shield layer includes a plurality of sub light-shield layers;

at least one of the plurality of sub light-shield layers on said distribution transfer unit serves as an interconnect electrically connected to at least another one of the plurality of distribution transfer electrodes; and the plurality of sub light-shield layers is disposed so as not to overlap with said horizontal transfer unit.

3. The solid-state imaging device according to claim 2, wherein at least one of the plurality of sub light-shield layers on said vertical transfer unit serves as an interconnect electrically connected to the plurality of vertical transfer electrodes included in the same row.

4. The solid-state imaging device according to claim 1, wherein the plurality of vertical transfer electrodes and the plurality of distribution transfer electrodes are electrically connected to said plurality of first light-shield layers.

5. The solid-state imaging device according to claim 1, wherein said plurality of first light-shield layers is provided in a layer closer to the semiconductor substrate than is the second light-shield layer.

6. The solid-state imaging device according to claim 1, wherein each of the plurality of distribution transfer electrodes has a longer electrode length in a vertical direction than each of the plurality of vertical transfer electrodes.

7. The solid-state imaging device according to claim 1, wherein the plurality of distribution transfer electrodes is configured in a single layer structure; and the plurality of distribution transfer electrodes has a longer electrode length in a horizontal direction than each of the plurality of vertical transfer electrodes.

8. The solid-state imaging device according to claim 1, further comprising an anti-reflection layer provided over said plurality of photoelectric conversion units and over a region between adjacent ones of the plurality of distribution transfer electrodes.

* * * * *